(12) United States Patent
Sugita et al.

(10) Patent No.: US 9,708,507 B2
(45) Date of Patent: Jul. 18, 2017

(54) METHOD FOR IMPROVING CHEMICAL RESISTANCE OF POLYMERIZED FILM, POLYMERIZED FILM FORMING METHOD, FILM FORMING APPARATUS, AND ELECTRONIC PRODUCT MANUFACTURING METHOD

(71) Applicant: TOKYO ELECTRON LIMITED, Tokyo (JP)

(72) Inventors: Kippei Sugita, Nirasaki (JP); Tatsuya Yamaguchi, Nirasaki (JP); Yoshinori Morisada, Nirasaki (JP); Makoto Fujikawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/632,311

(22) Filed: Feb. 26, 2015

(65) Prior Publication Data

US 2015/0240121 A1 Aug. 27, 2015

(30) Foreign Application Priority Data

Feb. 27, 2014 (JP) .................... 2014-037098

(51) Int. Cl.
*C09D 179/08* (2006.01)
*H01L 21/67* (2006.01)
(Continued)

(52) U.S. Cl.
CPC ......... *C09D 179/08* (2013.01); *C08G 73/105* (2013.01); *C08G 73/1071* (2013.01);
(Continued)

(58) Field of Classification Search
CPC ............ C09D 179/08; H01L 21/67109; H01L 21/31058; H01L 21/3065; H01L 21/02063; C08G 73/1071; C08G 73/105; C08L 7/00; C23C 16/56; C23C 16/30; B05D 3/0254; B05D 1/60
See application file for complete search history.

(56) References Cited

U.S. PATENT DOCUMENTS 4,468,411 A * 8/1984 Sloan .................... H01L 21/312
257/E21.259
4,699,803 A * 10/1987 Araps .................. H01L 21/312
216/18
(Continued)

FOREIGN PATENT DOCUMENTS

JP 2012015195 A 1/2012
JP 2013247285 A 12/2013
(Continued)

*Primary Examiner* — Anita Alanko
(74) *Attorney, Agent, or Firm* — Nath, Goldberg & Meyer; Jerald L. Meyer

(57) ABSTRACT

A method for improving a chemical resistance of a polymerized film, which is formed on a surface of a target object and to be processed by a chemical, includes: consecutively performing a treatment for improving the chemical resistance of the polymerized film subsequent to formation of the polymerized film within a processing chamber of a film forming apparatus where the polymerized film is formed, without unloading the target object from the processing chamber.

15 Claims, 10 Drawing Sheets

Polymerized film forming apparatus

Etching apparatus (51) Int. Cl.
*C08G 73/10* (2006.01)
*C23C 16/30* (2006.01)
*C23C 16/56* (2006.01)
*H01L 21/3105* (2006.01)
*B05D 1/00* (2006.01)
*B05D 3/02* (2006.01)
*H01L 21/3065* (2006.01)
*H01L 21/02* (2006.01)

(52) U.S. Cl.
CPC ............. *C23C 16/30* (2013.01); *C23C 16/56* (2013.01); *H01L 21/67109* (2013.01); *B05D 1/60* (2013.01); *B05D 3/0254* (2013.01); *H01L 21/02063* (2013.01); *H01L 21/3065* (2013.01); *H01L 21/31058* (2013.01)

(56) References Cited

U.S. PATENT DOCUMENTS

| | | | | |
|---|---|---|---|---|
| 4,915,894 A * | 4/1990 | Mitsui | ................... | B29C 55/005 264/212 |
| 6,232,238 B1 * | 5/2001 | Chang | ..................... | H01L 24/11 134/1.2 |
| 6,252,154 B1 * | 6/2001 | Kamada | .................. | H01L 35/32 136/201 |
| 6,593,649 B1 * | 7/2003 | Lin | ....................... | H01L 23/528 257/293 |
| 7,348,080 B2 * | 3/2008 | Kanakarajan | ........... | B32B 15/08 174/254 |
| 7,923,383 B2 * | 4/2011 | Beekmann | ............ | C23C 16/401 257/E21.262 |
| 8,975,753 B2 * | 3/2015 | Williams | .......... | H01L 21/76898 257/774 |
| 2002/0058149 A1 * | 5/2002 | Yamamoto | ............... | B32B 15/08 428/473.5 |
| 2003/0049487 A1 * | 3/2003 | Katsuki | ................... | H05K 3/381 428/626 |
| 2004/0232832 A1 * | 11/2004 | Kubota | ............... | H01L 51/5237 313/512 |
| 2004/0242008 A1 * | 12/2004 | Sato | .................. | H01L 21/76802 438/700 |
| 2005/0048755 A1 * | 3/2005 | Roche | ............... | H01L 21/32134 438/612 |
| 2011/0101520 A1 * | 5/2011 | Liu | ........................ | H01L 23/48 257/737 |
| 2012/0028061 A1 * | 2/2012 | Matsumoto | ............. | B29C 41/24 428/473.5 |
| 2012/0192793 A1 * | 8/2012 | Fukumori | ........... | C23C 16/4412 118/724 |
| 2012/0241005 A1 * | 9/2012 | Yamaguchi | ............. | B29C 41/24 136/264 |
| 2013/0008381 A1 * | 1/2013 | Fukumori | ................ | B01D 8/00 118/715 |
| 2015/0235949 A1 * | 8/2015 | Yu | ....................... | H01L 23/3128 257/774 |

FOREIGN PATENT DOCUMENTS

| | | |
|---|---|---|
| JP | 2013247287 A | 12/2013 |
| JP | 2014093331 A | 5/2014 |
| JP | 2014145115 A | 8/2014 |
| JP | 2014150144 A | 8/2014 |
| JP | 2014154682 A | 8/2014 |

* cited by examiner

Bonding apparatus

FIG. 3C

Polishing apparatus

FIG. 3D

Insulating film forming apparatus

FIG. 3E

Etching apparatus

FIG. 3F

Polymerized film forming apparatus

FIG. 3G

Polymerized film forming apparatus

FIG. 3H

Etching apparatus

FIG. 3I

Cleaning apparatus

Polyimide

FIG. 6B

Polyamic acid (polyamide)

FIG. 6C

Pyromellitic acid

Oxydianiline

METHOD FOR IMPROVING CHEMICAL RESISTANCE OF POLYMERIZED FILM, POLYMERIZED FILM FORMING METHOD, FILM FORMING APPARATUS, AND ELECTRONIC PRODUCT MANUFACTURING METHOD

CROSS-REFERENCE TO RELATED APPLICATION

This application claims the benefit of Japanese Patent Application No. 2014-037098, filed on Feb. 27, 2014, in the Japan Patent Office, the disclosure of which is incorporated herein in its entirety by reference.

TECHNICAL FIELD

The present disclosure relates to a method for improving a chemical resistance of a polymerized film, a polymerized film forming method, a film forming apparatus, and an electronic product manufacturing method.

BACKGROUND

It is studied that a polymerized film, e.g., a high-molecular thin film represented by a polyimide thin film, is used as an interlayer insulating film of an electronic product, e.g., a semiconductor integrated circuit device, or as a liquid crystal alignment film of a flat panel display, e.g., a liquid crystal display device.

The high-molecular thin film can be formed by a deposition polymerization method which vaporizes a source monomer dissolved in a solvent, deposits the vaporized source monomer on a surface of a target object and subjects the deposited source monomer to a polymerization reaction on the surface of the target object.

In the deposition polymerization method, a polymerized film can be formed using a film forming apparatus which is a semiconductor manufacturing apparatus. Thus, the polymerized film can be used not only as a passivation film of a semiconductor integrated circuit device but also as an interlayer insulating film in an internal structure of a semiconductor integrated circuit device.

In a case of using the polymerized film as an interlayer insulating film, the polymerized film is exposed to a machining process such as etching or the like. After the machining process, a process using a chemical, e.g., a cleaning process using a cleaning solution, is performed with respect to the polymerized film.

However, it was found that, if the process using a chemical, e.g., the cleaning process using a cleaning solution, is performed with respect to the polymerized film, there is posed a problem of deterioration of film quality (e.g., reduction of a film thickness) of the polymerized film, alteration of the polymerized film, or peeling of the polymerized film in the worst case. Presumably, this is because the polymerized film is damaged by the cleaning solution.

SUMMARY

Some embodiments of the present disclosure provide a method for improving a chemical resistance of a polymerized film and a polymerized film forming method, which can improve the chemical resistance of the polymerized film without using an additional processing apparatus for improving the chemical resistance of the polymerized film, a polymerized film forming apparatus which can implement the polymerized film forming method, and an electronic product manufacturing method using the polymerized film forming method.

According to one embodiment of the present disclosure, there is provided a method for improving a chemical resistance of a polymerized film, which is formed on a surface of a target object and to be processed by a chemical. The method includes: consecutively performing a treatment for improving the chemical resistance of the polymerized film subsequent to formation of the polymerized film within a processing chamber of a film forming apparatus where the polymerized film is formed, without unloading the target object from the processing chamber.

According to another embodiment of the present disclosure, there is provided a polymerized film forming method for forming a polymerized film on a surface of a target object. The method includes: accommodating the target object in a processing chamber of a film forming apparatus; forming the polymerized film on the surface of the target object within the processing chamber; and consecutively performing a treatment for improving a chemical resistance of the polymerized film subsequent to forming the polymerized film within the processing chamber of the film forming apparatus where the polymerized film is formed, without unloading the target object from the processing chamber.

According to still another embodiment of the present disclosure, there is provided an electronic product manufacturing method for manufacturing an electronic product using a target object having an electric element arranged therein. The method includes: forming a polymerized film on a surface of the target object; performing a treatment for improving a chemical resistance of the polymerized film with respect to the polymerized film; performing an etching process with respect to the polymerized film having an improved chemical resistance; and performing a cleaning process using a cleaning agent with respect to the polymerized film having been subjected to the etching process, wherein the treatment for improving the chemical resistance of the polymerized film is consecutively performed subsequent to formation of the polymerized film within a processing chamber where the polymerized film is performed, without unloading the target object having the polymerized film formed thereon from the processing chamber.

According to still another embodiment of the present disclosure, there is provided a film forming apparatus for forming a polymerized film on a surface of a target object using a first source gas containing a first monomer and a second source gas containing a second monomer. The apparatus includes: a processing chamber that accommodates the target object; a film forming process gas supply mechanism that supplies the first source gas and the second source gas into the processing chamber; an inert gas supply mechanism that supplies an inert gas into the processing chamber; a heating device that heats the target object; a cooling device that suppresses heating of the target object; an exhaust device that evacuates an interior of the processing chamber; and a controller that controls the film forming process gas supply mechanism, the inert gas supply mechanism, the heating device, the cooling device, and the exhaust device, wherein the controller controls the film forming process gas supply mechanism, the inert gas supply mechanism, the heating device, the cooling device, and the exhaust device to perform the polymerized film forming method of some embodiments of the present disclosure.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, one embodiment of the present disclosure will be described with reference to the drawings. Throughout the drawings, identical parts will be designated by like reference symbols. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a description will be made on one example of a film forming apparatus, which can form a polymerized film using a deposition polymerization method and can implement a polymerized film forming method according to one embodiment of the present disclosure.

<Film Forming Apparatus>

Figure 1:
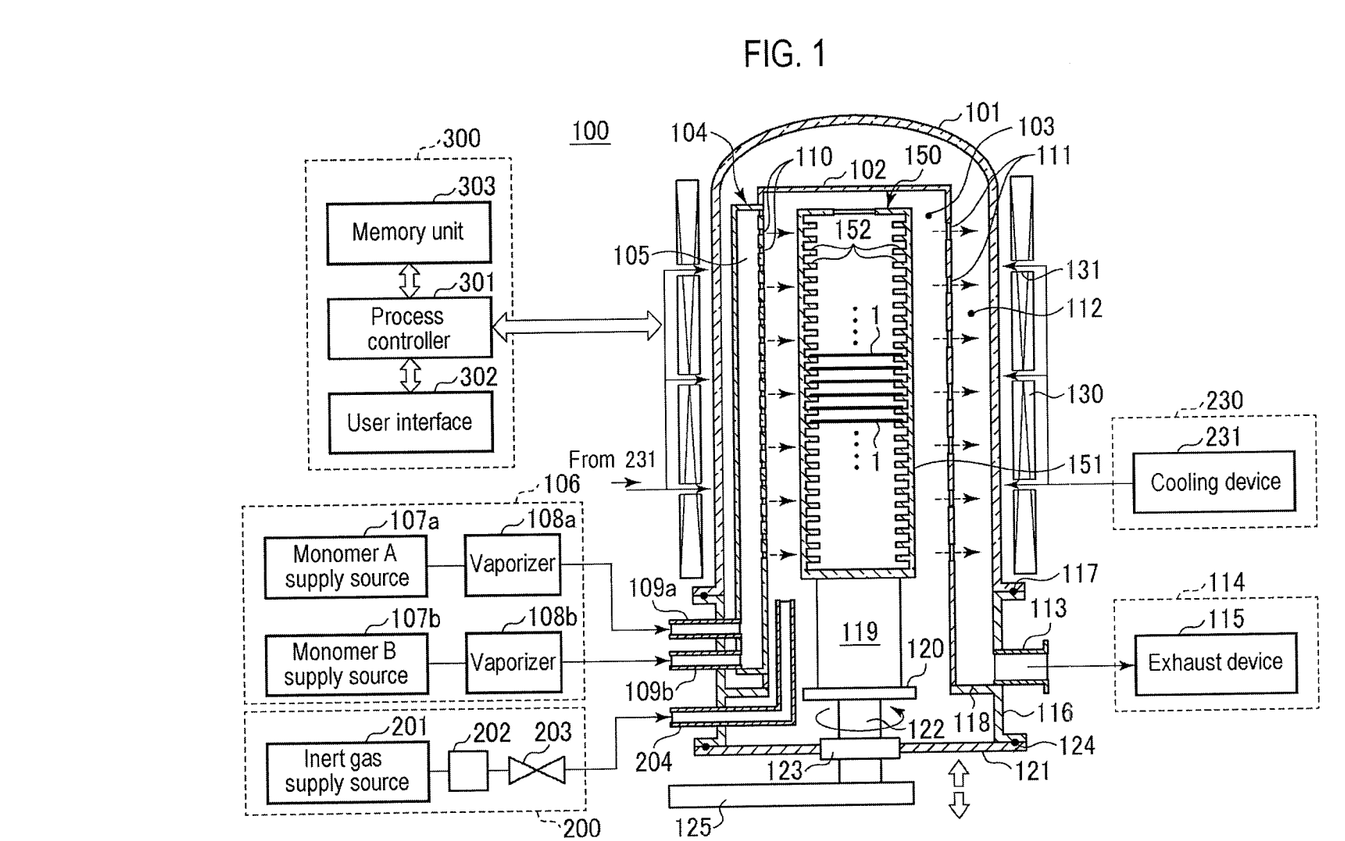
FIG. 1 is a sectional view schematically showing one example of a polymerized film forming apparatus capable of implementing a polymerized film forming method according to one embodiment of the present disclosure.

FIG. 1 is a sectional view schematically showing one example of a polymerized film forming apparatus capable of implementing a polymerized film forming method according to one embodiment of the present disclosure.

As shown in FIG. 1, a film forming apparatus 100 is a longitudinal batch-type film forming apparatus that performs a film forming process with a plurality of target objects stacked on a boat in a height direction. The film forming apparatus 100 includes a cylindrical outer tube 101 provided with a ceiling and a cylindrical inner tube 102 installed inside the outer tube 101 and provided with a ceiling. The outer tube 101 and the inner tube 102 are made of, e.g., quartz. The inside of the inner tube 102 serves as a processing chamber 103 which accommodates a plurality of target objects, e.g., semiconductor wafers (e.g., silicon wafers) (hereinafter simply referred to as "wafers") 1 and performs a polymerized film forming process with respect to all of the wafers 1. In this example, a polymerized film, e.g., a polyimide film is formed on a target surface of each of the wafers 1 using a deposition polymerization method.

As a gas introduction unit for introducing a film forming process gas into the processing chamber 103, an injector 104 extending in a height direction, e.g., in a vertical direction, is installed at one side of a sidewall of the inner tube 102. The injector 104 includes a gas diffusion space 105 in its interior. The gas diffusion space 105 is connected to a film forming process gas supply mechanism 106.

The film forming process gas supply mechanism 106 of the present embodiment includes a monomer A supply source 107a which serves as a supply source of a monomer A and a monomer B supply source 107b which serves as a supply source of a monomer B. In the present embodiment, a polyimide film is formed as a polymerized film. For this purpose, the monomer A is selected from those that may be polymerized with the monomer B to form an imide bond.

The monomer A supply source 107a and the monomer B supply source 107b store a monomer A and the monomer B which are a liquid state or dissolved in a solvent. These monomers A and B are fed to vaporizers 108a and 108b. The vaporizers 108a and 108b vaporize the fed monomers A and B. The vaporizers 108a and 108b are connected to gas supply pipes 109a and 109b, respectively. The gas supply pipes 109a and 109b are connected to the gas diffusion space 105. The vaporized monomers A and B are supplied together with a carrier gas, e.g., a nitrogen gas, to the gas diffusion space 105 through the gas supply pipes 109a and 109b. The vaporized monomers A and B are injected into the inside of the processing chamber 103, e.g., in a horizontal direction, through a plurality of discharge holes 110 formed in the injector 104.

The film forming apparatus 100 includes a gas supply mechanism 200 that supplies an inert gas. The gas supply mechanism 200 includes an inert gas supply source 201 which is connected to a supply nozzle 204 through a flow rate controller 202 and an on-off valve 203. One example of the inert gas is a nitrogen ($N_2$) gas.

The supply nozzle 204 is formed of, e.g., a quartz pipe. The supply nozzle 204 passes through a sidewall of a manifold 116, is bent upward, and extends vertically. The inert gas is supplied into the processing chamber 103 from the supply nozzle 204. The inert gas is used in, e.g., purging the inside of the processing chamber 103.

A plurality of exhaust holes 111 for evacuating the inside of the processing chamber 103 are formed at the other side of the sidewall of the inner tube 102. The plurality of exhaust holes 111 communicate with a space defined by the outer tube 101 and the inner tube 102, respectively. The space serves as an exhaust space 112. The exhaust space 112 is connected through an exhaust pipe 113 to an exhaust mechanism 114 that evacuates the interior of the processing chamber 103. The exhaust mechanism 114 includes an exhaust device 115, e.g., a vacuum pump. The exhaust mechanism 114 not only evacuates the internal atmosphere of the processing chamber 103 but also sets the internal pressure of the processing chamber 103 to a pressure required in the process.

The open end portion (bottom side) of the outer tube 101 is connected through a seal member 117 such as an O-ring to, e.g., a manifold 116 which is formed into a cylindrical shape by stainless steel. The manifold 116 supports the bottom side of the outer tube 101. Furthermore, the open end portion of the inner tube 102 is connected to, e.g., an inner tube support portion 118 formed in a flange shape on the inner circumferential surface of the manifold 116.

A boat 150 capable of holding a plurality of target objects, e.g., wafers 1, in a stack can be inserted from the lower side of the manifold 116 into the processing chamber 103 through the inside of the inner tube support portion 118. The boat 150 is made of quartz and includes a plurality of posts 151. A plurality of grooves 152 are formed in the posts 151. The plurality of wafers 1 are supported by the plurality of grooves 152.

The boat 150 is placed on a table 120 with a heat-insulating cylinder 119 made of quartz therebetween. The table 120 is supported on a rotation shaft 122 passing through a lid 121 that opens and closes a lower end opening of the manifold 116 and is made of, e.g., stainless steel. For example, a magnetic fluid seal 123 is installed in a through-hole portion of the lid 121 through which the rotation shaft 122 passes. The magnetic fluid seal 123 rotatably supports the rotation shaft 122 while hermetically sealing the rotation shaft 122. A seal member 124 formed of, e.g., an O-ring, is installed between the peripheral portion of the lid 121 and the lower end of the manifold 116. Thus, the inside of the processing chamber 103 is kept sealed. The rotation shaft 122 is installed at the tip of an arm 125, for example, which is supported by an elevator mechanism (not shown) such as a boat elevator. Consequently, the boat 150 and the lid 121 are unitarily moved up and down, and are inserted into or removed from the inside of the processing chamber 103.

A heating device 130 is installed around the outer circumference of the outer tube 101 so as to surround the outer tube 101. The heating device 130 heats the plurality of wafers 1 accommodated in the processing chamber 103.

The film forming apparatus 100 includes a cooling mechanism 230. A cooling device 231 that blows a cooling fluid, e.g., a cooling gas, is installed in the cooling mechanism 230. A plurality of openings 131 are formed in the heating device 130, and cooling gas pipes (not shown) are formed in the openings 131 so as to reach the outer surface of the outer tube 101. The cooling device 231 supplies the cooling gas toward the outer surface of the outer tube 101 through the cooling gas pipes (not shown). The plurality of wafers 1 accommodated in the processing chamber 103 are cooled as the cooling gas is supplied to the outer surface of the outer tube 101.

A control unit 300 is connected to the film forming apparatus 100. The control unit 300 includes a process controller 301 consisting of, e.g., a microprocessor (or a computer). The process controller 301 controls respective component parts of the film forming apparatus 100. A user interface 302 and a memory unit 303 are connected to the process controller 301.

The user interface 302 includes an input unit including a touch panel display, a keyboard or the like for enabling an operator to input a command or perform other operations in order to manage the film forming apparatus 100, and a display unit including a display for visually displaying the operating situation of the film forming apparatus 100.

The memory unit 303 stores a so-called process recipe which includes a control program for realizing, under the control of the process controller 301, various kinds of processes such as a film forming process implemented by the film forming apparatus 100, and a program for causing the respective component parts of the film forming apparatus 100 to implement processes according to process conditions. The process recipe is stored in a storage medium of the memory unit 303. The storage medium may be a hard disk or a semiconductor memory. The storage medium may be a portable storage medium such as a CD-ROM, a DVD, a flash memory or the like. In addition, the process recipe may be appropriately transmitted from other devices, e.g., via a dedicated line.

If necessary, the process recipe is read out from the memory unit 303 in response to an operator's instruction transmitted from the user interface 302. The process controller 301 performs the process according to the read-out process recipe, whereby the film forming apparatus 100 performs the processes of a polymerized film forming method according to one embodiment to be described below, under the control of the process controller 301.

<Polymerized Film Forming Method>

Figure 2:
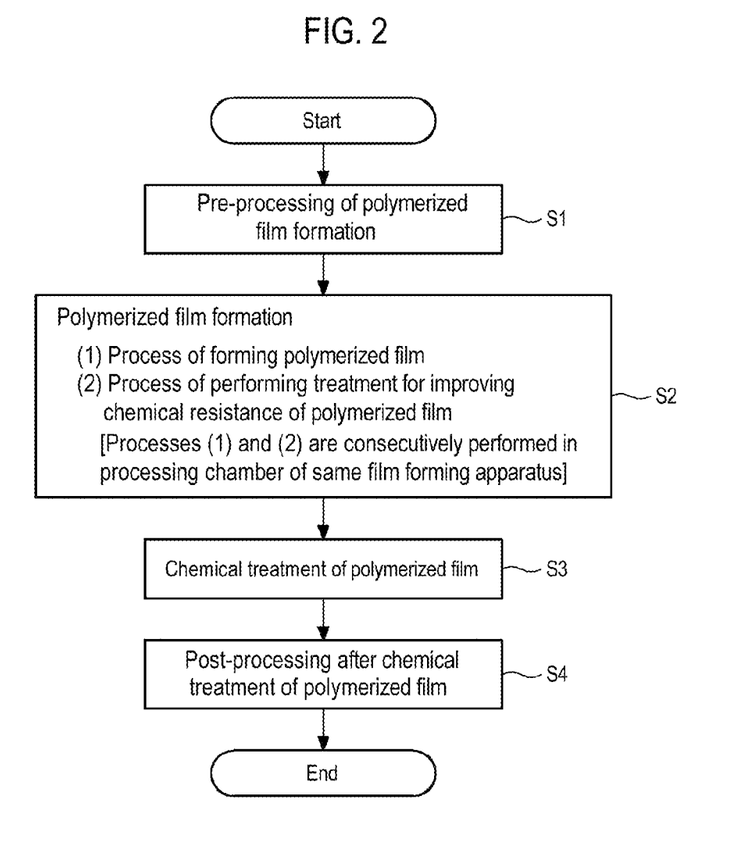
FIG. 2 is a flowchart illustrating a basic flow of the polymerized film forming method according to one embodiment of the present disclosure.

FIG. 2 is a flowchart illustrating a basic flow of a polymerized film forming method according to one embodiment of the present disclosure.

As illustrated in FIG. 2, in manufacturing an electronic product using a polymerized film, the following essential steps are sequentially performed: pre-processing before polymerized film formation (Step S1), polymerized film formation (Step S2), chemical treatment of the polymerized film (Step S3), and post-processing after the chemical treatment of the polymerized film (Step S4). One specific example of the chemical treatment is cleaning of the polymerized film using a cleaning agent.

In the polymerized film forming method according to one embodiment, the polymerized film formation in Step S2 includes the following sequential processes of: (1) a process of forming the polymerized film; and then (2) a process of performing treatment for improving a chemical resistance of the polymerized film. The processes (1) and (2) are consecutively performed in the same film forming apparatus, e.g., the processing chamber 103 of the film forming apparatus 100 shown in FIG. 1. One specific example of the process (2) is heat treatment.

<Electronic Product Manufacturing Method>

A description will now be made on one example of an electronic product manufacturing method using the polymerized film forming method according to one embodiment of the present disclosure. One example of the manufactured electronic product includes a three-dimensionally packaged LSI (Large Scale Integration) in which a plurality of LSI chips are packaged in a height direction. The LSI chips used in the three-dimensionally packaged LSI are provided therein with through vias for electrically interconnecting the LSI chips staked in the height direction. An insulating polymerized film is used as sidewall insulating films of the through vias. The polymerized film forming method according to one embodiment of the present disclosure is used in forming the insulating polymerized film.

FIGS. 3A to 3J are sectional views illustrating major processes of one example of an electronic product manufacturing method using the polymerized film forming method according to one embodiment of the present disclosure.

Figure 3A:
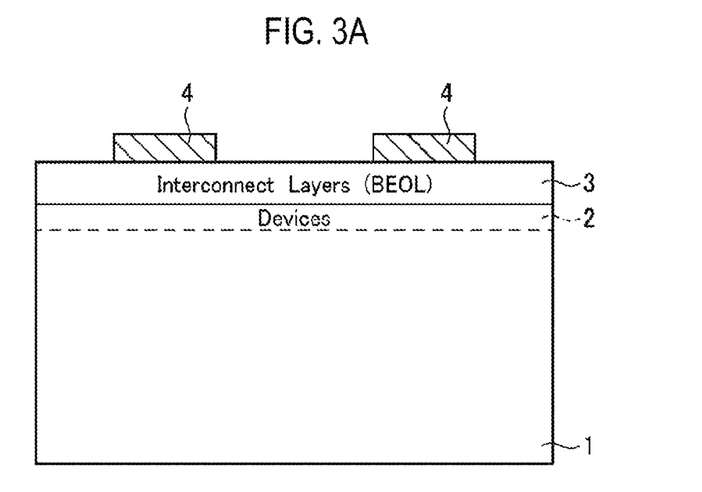
FIGS. 3A to 3J are sectional views illustrating major processes of one example of an electronic product manufacturing method using the polymerized film forming method according to one embodiment of the present disclosure.

First, FIG. 3A illustrates a silicon substrate 1 which has been subjected to a wafer process including: forming semiconductor devices such as transistors or the like in a device formation region (Devices) 2 of a semiconductor substrate, e.g., the silicon substrate (or a silicon wafer) 1; forming an internal wiring formation region (Interconnect Layers (BEOL)) 3 in which internal wiring for electrically interconnecting the semiconductor devices are formed on the device formation region 2; and forming front bump electrodes 4, which are connected to the internal wiring so as to serve as external terminals of LSI chips, on the internal wiring formation region 3. Details of the insides of the device formation region 2 and the internal wiring formation region 3 are omitted in the present disclosure.

Figure 3B:
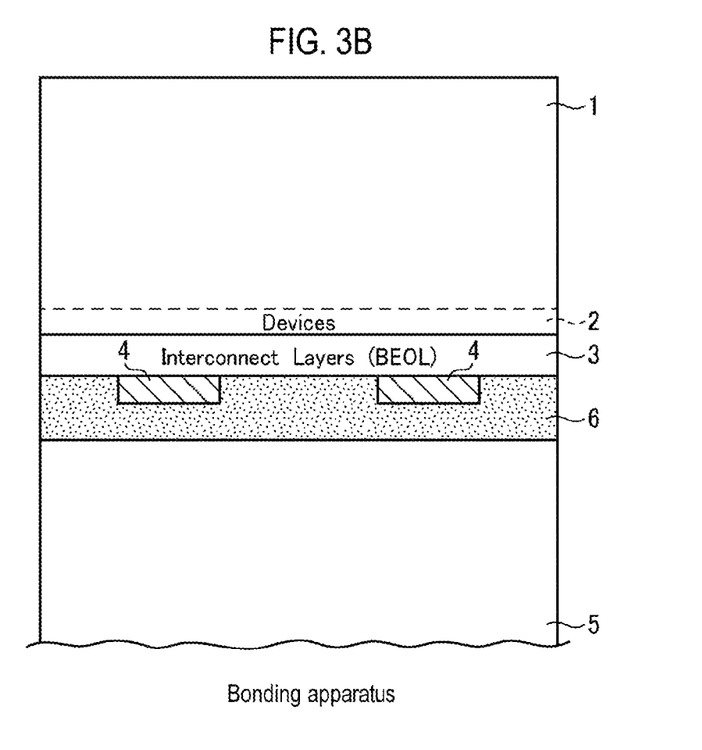

Next, as illustrated in FIG. 3B, a support substrate 5 having a bonding layer 6 on the surface thereof is prepared. Then, the support substrate 5 having the bonding layer 6 on the surface thereof and the silicon substrate 1 illustrated in FIG. 3A are kept in an upside-down state and loaded into a bonding apparatus that bonds the substrates (wafers). Then, the front surface of the silicon substrate 1 on which the front bump electrodes 4 are formed is caused to face the bonding layer 6 of the support substrate 5. The silicon substrate 1 and the support substrate 5 are provisionally bonded using the bonding apparatus with the bonding layer 6 interposed therebetween (hereinafter, the silicon substrate 1 thus bonded will be referred to as a "provisionally-bonded silicon substrate 1").

Figure 3C:
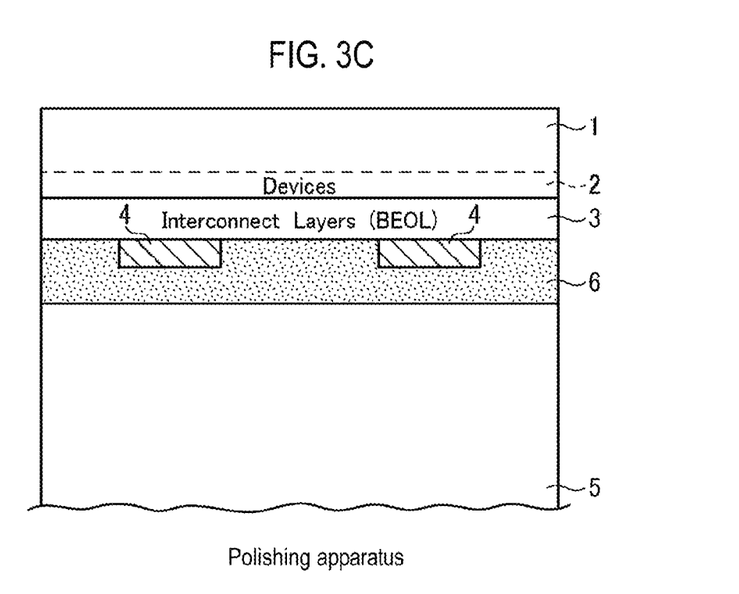

Next, as illustrated in FIG. 3C, the provisionally-bonded silicon substrate 1 is unloaded from the bonding apparatus and then loaded into a polishing apparatus. Then, the rear surface of the silicon substrate 1 is polished using the polishing apparatus, thereby reducing the thickness of the silicon substrate 1.

Figure 3D:
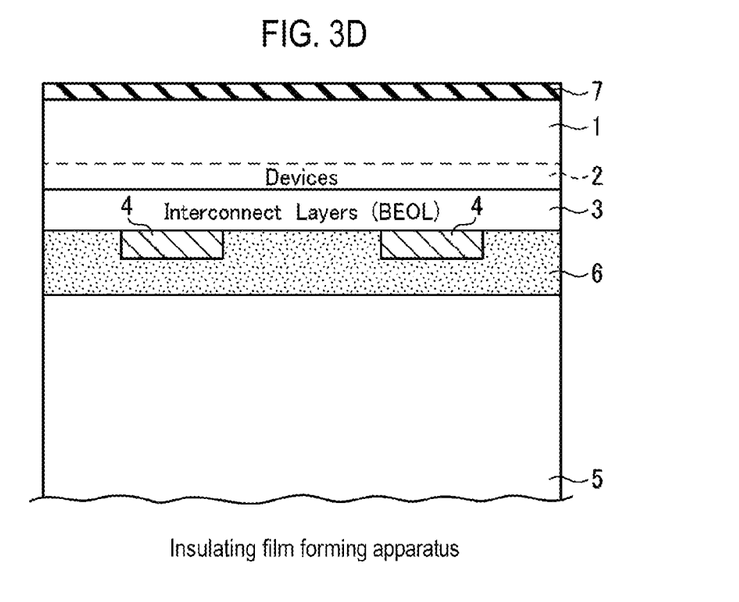

Next, as illustrated in FIG. 3D, the provisionally-bonded silicon substrate 1 having a reduced thickness is unloaded from the polishing apparatus and then loaded into an insulating film forming apparatus. Then, a silicon nitride, a silicon oxide or the like is deposited on the rear surface of the provisionally-bonded silicon substrate 1 through the use of the insulating film forming apparatus, thereby forming an insulating film 7 such as a silicon nitride film, a silicon oxide film or the like on the rear surface of the provisionally-bonded silicon substrate 1.

Figure 3E:
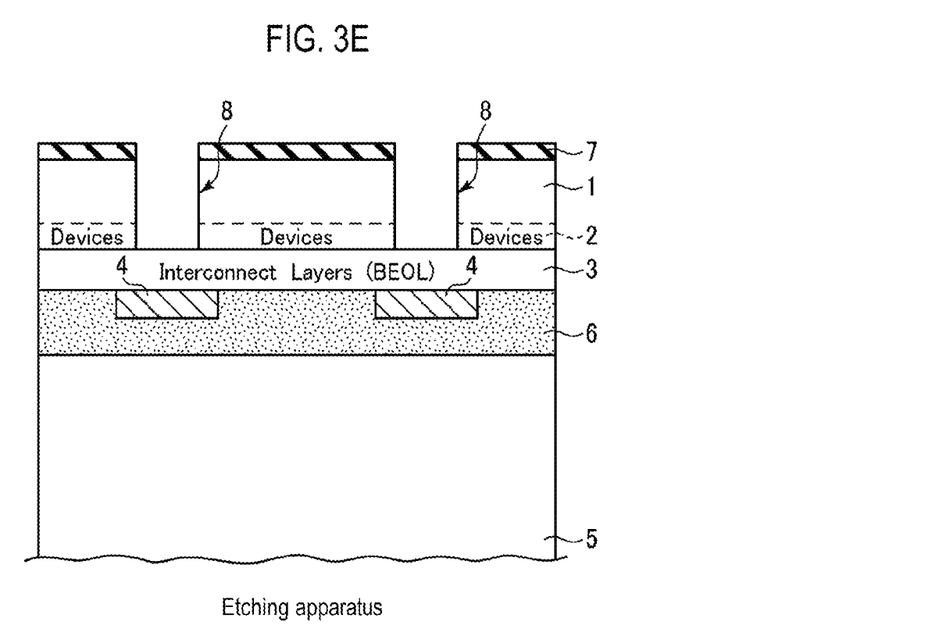

Next, as illustrated in FIG. 3E, the provisionally-bonded silicon substrate 1 having the insulating film 7 formed thereon is unloaded from the insulating film forming apparatus. A mask layer (not shown) corresponding to a through via formation pattern is formed on the rear surface of the provisionally-bonded silicon substrate 1 through the use of a photoresist or the like. Thereafter, the provisionally-bonded silicon substrate 1 is loaded into an etching apparatus. Then, the provisionally-bonded silicon substrate 1 is etched using the etching apparatus, whereby hole-shaped trenches 8 reaching the internal wiring are formed in the provisionally-bonded silicon substrate 1. The trenches 8 become through-holes into which through vias are embedded. The processes performed thus far correspond to the pre-processing of polymerized film formation (Step S1) illustrated in FIG. 2.

Figure 3F:
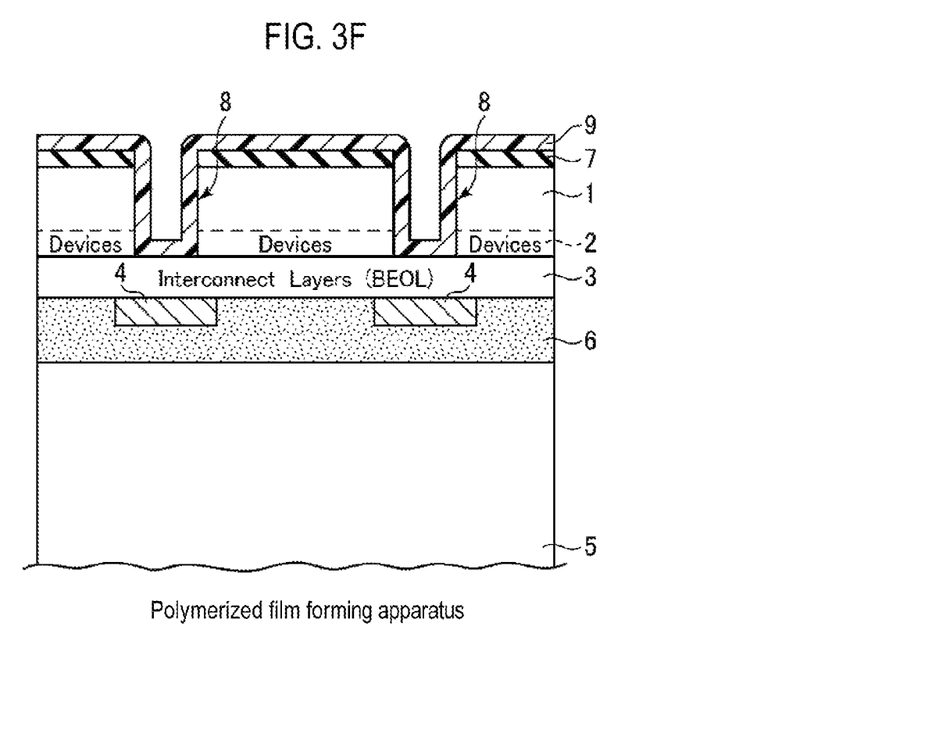

Next, as illustrated in FIG. 3F, the provisionally-bonded silicon substrate 1 having the trenches 8 formed therein is unloaded from the etching apparatus and loaded into, e.g., the polymerized film forming apparatus 100 shown in FIG. 1. Then, in the processing chamber 103 of the film forming apparatus 100, a polymerized film 9 is formed on the insulating film 7 and on the side and bottom surfaces of the trenches 8. An insulating polymerized film is formed as the polymerized film 9. One example of the insulating polymerized film 9 is a polyimide film. Thus, the polymerized film 9 serves as an insulating film which insulates the silicon substrate 1 from the through vias to be formed later. The polyimide film as the polymerized film 9 may be formed by, e.g., a deposition polymerization method. The polyimide film formed by the deposition polymerization method may be formed by, for example, using pyromellitic acid dianhydride (PMDA: $C_{10}H_2O_6$) and 4,4'-oxydianiline (ODA: $C_{12}H_{12}N_2O$) as a first monomer and a second monomer, respectively, and simultaneously or alternately supplying a film forming process gas containing these monomers into the processing chamber 103 of the film forming apparatus 100 shown in FIG. 1.

Figure 3G:
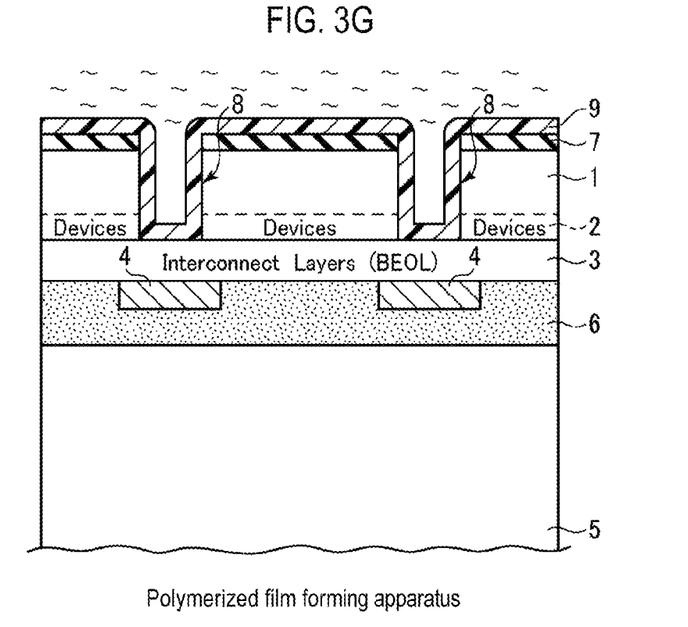

Next, as illustrated in FIG. 3G, a treatment for improving a chemical resistance of the polymerized film 9 is performed with respect to the provisionally-bonded silicon substrate 1 having the polymerized film 9 formed thereon. One example of this treatment is heat treatment. The heat treatment is consecutively performed after formation of the polymerized film 9 in the processing chamber 103 of the film forming apparatus 100. One example of the timing of the treatment for improving the chemical resistance of the polymerized film 9 is illustrated in FIG. 4.

Figure 4:
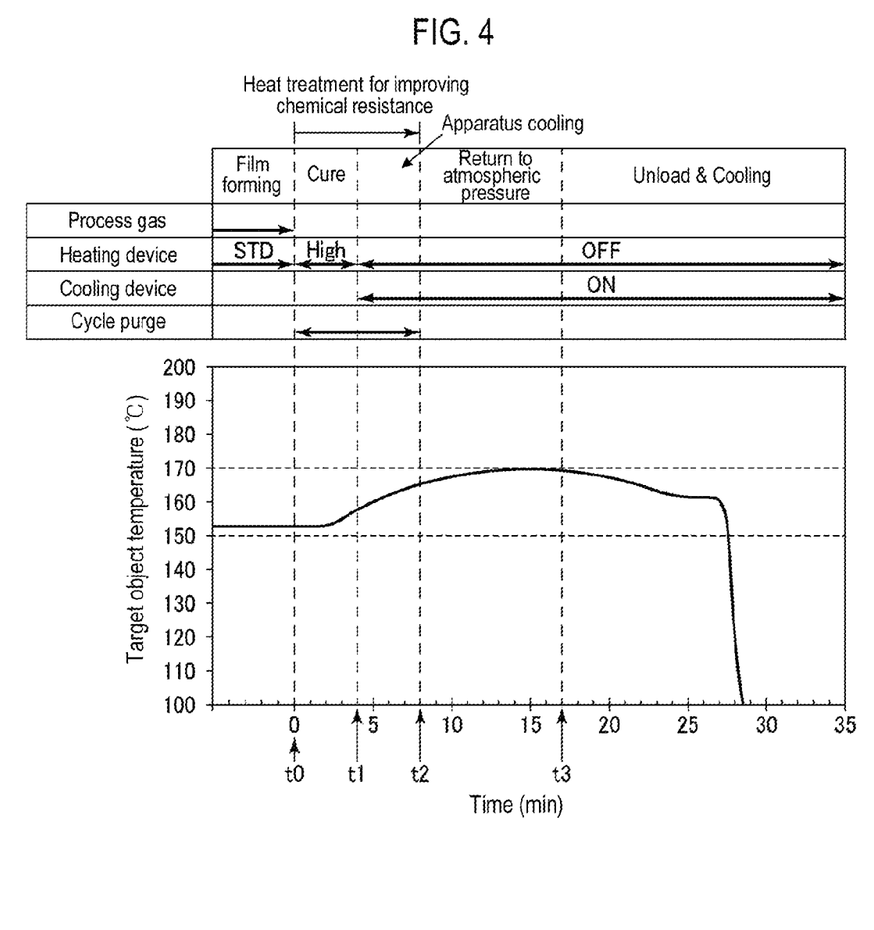
FIG. 4 is a timing chart illustrating one example of treatment for improving a chemical resistance of a polymerized film, which is performed in the polymerized film forming method according to one embodiment of the present disclosure.

FIG. 4 illustrates one example of the timing from just before the completion of the formation of the polymerized film 9 to the chemical resistance improving treatment, the unloading of the target object (the provisionally-bonded silicon substrate 1) having the polymerized film 9 formed thereon from the polymerized film forming apparatus 100 and the cooling of the target object, and a temperature change of the target object.

As indicated by time t0 in FIG. 4, when the formation of the polymerized film 9 is completed, supply of the film forming process gas is stopped and a cycle purge which repeats supply and exhaust of an inert gas is started. Furthermore, the output of the heating device 130 is raised to be higher than an output (STD) available in the film forming process. In this example, the output of the heating device 130 is increased to a maximum level (High). Thus, the temperature of the target object, i.e., the provisionally-bonded silicon substrate 1 in this example, which is accommodated in the processing chamber 103, begins to rise from about 150 degrees C. used in the film forming process. The time zone during which the output of the heating device 130 is raised to be higher than the output (STD) available in the film forming process will be referred to as "cure" in the present disclosure.

Next, as indicated by time t1 in FIG. 4, when a predetermined "cure" time is elapsed, the output of the heating device 130 is lowered. In this example, the output is lowered from the maximum level (High) to a stop level (OFF). Furthermore, the cooling device 231 is operated (ON). This suppresses an increase in the temperature of the provisionally-bonded silicon substrate 1 accommodated in the processing chamber 103. In the present disclosure, the time zone during which the output of the heating device 130 is lowered below the output used in the "cure" time zone and the increase in the temperature of the provisionally-bonded silicon substrate 1 is suppressed by operating the cooling device 231 will be referred to as "apparatus cooling".

Next, as indicated by time t2 in FIG. 4, when a predetermined "apparatus cooling" time elapses, the cycle purge is stopped. In the present disclosure, the time zone during which the cycle purge is continuously performed and the temperature of the provisionally-bonded silicon substrate 1 is raised to be higher than the temperature used in the film forming process will be referred to as "chemical resistance improving heat treatment". When the "chemical resistance improving heat treatment" is completed, the inside of the processing chamber 103 is opened to the atmosphere. Thus, the internal pressure of the processing chamber 103 is gradually returned from, e.g., the pressure used in the film forming process or the pressure used in the "chemical resistance improving heat treatment" toward atmospheric pressure.

Next, as indicated by time t3 in FIG. 4, when the internal pressure of the processing chamber 103 is returned to atmospheric pressure, the provisionally-bonded silicon substrate 1 is unloaded from the processing chamber 103. Then, the provisionally-bonded silicon substrate 1 is cooled by a cooling device installed outside the processing chamber 103.

Figure 3H:
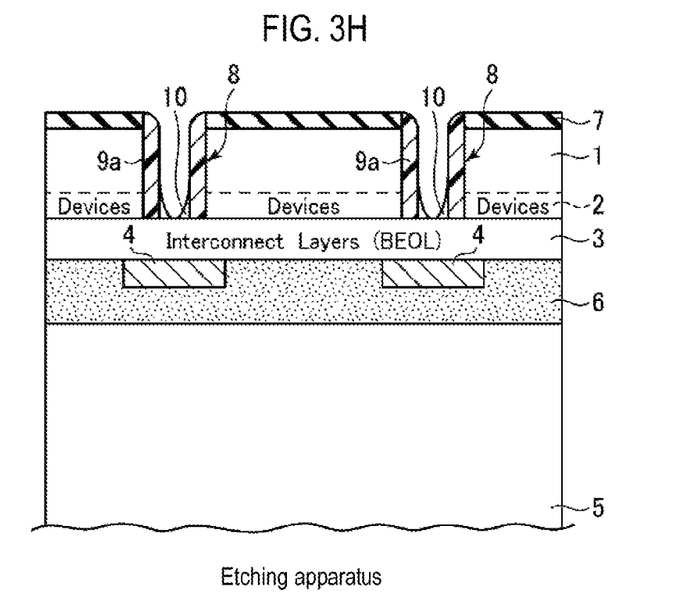

Next, as illustrated in FIG. 3I1, the provisionally-bonded silicon substrate 1 which has been subjected to the chemical resistance improving heat treatment of the polymerized film 9 is unloaded from the film forming apparatus 100 and is loaded into the etching apparatus. Then, the polymerized film 9 is anisotropically etched by the etching apparatus and thus is moved back (etch-back). Thus, the polymerized film 9 remains in a sidewall shape on the side surfaces of the trenches 8, whereby sidewall insulating films 9a are formed. When etching the polymerized film 9, etching residues 10 are generated. The etching residues 10 remain in, e.g., the bottom portions of the trenches 8.

Figure 3I:
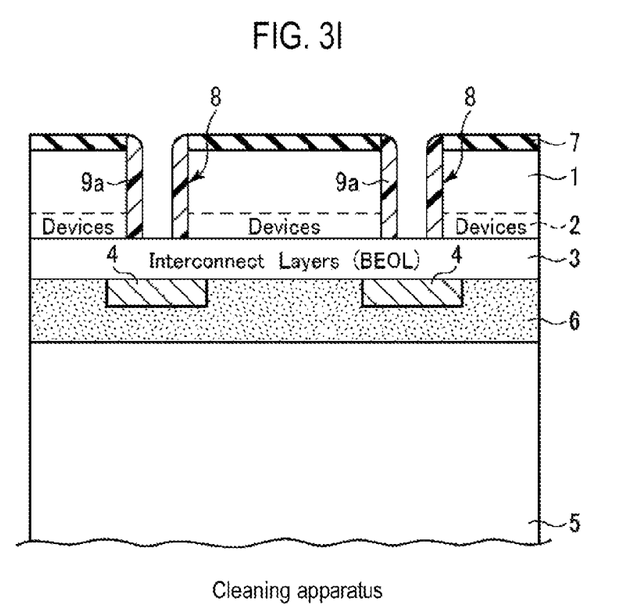

Next, as illustrated in FIG. 3I, the provisionally-bonded silicon substrate 1 having the sidewall insulating films 9a formed thereon is unloaded from the etching apparatus and is loaded into a cleaning apparatus to remove the etching residues 10. Then, within the cleaning apparatus, the provisionally-bonded silicon substrate 1 is cleaned using a cleaning agent. This process corresponds to the chemical treatment of the polymerized film illustrated in FIG. 2. As the cleaning agent, it may be possible to select a cleaning agent capable of removing the etching residues 10 illustrated in FIG. 3H. The etching residues 10 are removed by cleaning the provisionally-bonded silicon substrate 1 with the cleaning agent. The etching residues 10 generated when etching the polymerized film 9 are mainly composed of organic polymers. One example of a cleaning agent capable of removing the organic polymers includes a cleaning agent containing an alkaline compound as a cleaning compound (e.g., an aqueous solution containing an alkaline compound or an alkaline cleaning solution).

Figure 3J:
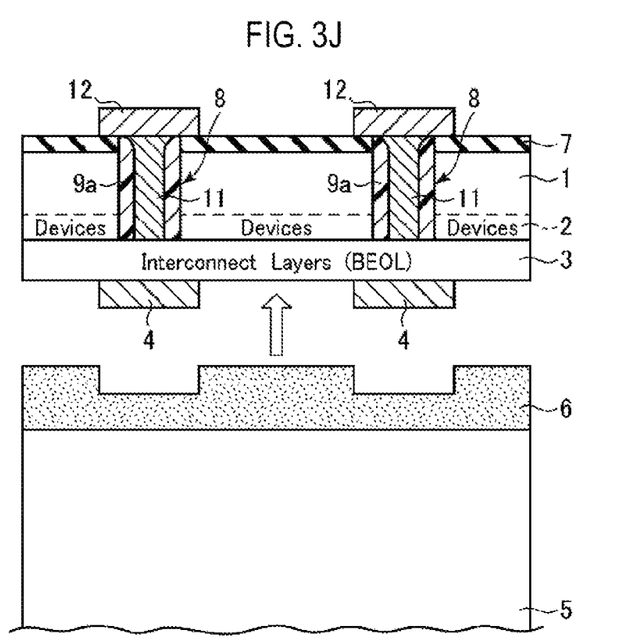

Next, as illustrated in FIG. 3J, the provisionally-bonded silicon substrate 1 which has been subjected to the cleaning process is unloaded from the cleaning apparatus and is subjected to the post-processing after the chemical treatment of the polymerized film (Step S4) illustrated in FIG. 2. For example, In Step S4, according to a well-known method, the insides of the trenches 8 insulated from the silicon substrate 1 by the sidewall insulating films 9a are buried with through vias 11 which are electrically connected to the internal wiring, and back bump electrodes 12 are formed in portions of the through vias 11 exposed at the rear surface side of the silicon substrate 1. When the formation of the back bump electrodes 12 is completed, the silicon substrate 1 is peeled from the support substrate 5. Thus, there is formed an LSI chip having the front bump electrodes 4 and the back bump electrodes 12, which serve as external terminals, formed on the front surface and the rear surface of the silicon substrate 1, respectively.

In the polymerized film forming method according to one embodiment, the chemical resistance improving heat treatment is performed prior to performing the cleaning process with respect to the polymerized film 9. For that reason, even if the cleaning process is performed with respect to the polymerized film 9, as compared with a case where the chemical resistance improving heat treatment is not performed, it is possible to suppress deterioration in quality (thickness reduction, etc.) of the polymerized film 9, alteration of the polymerized film 9 or peeling of the polymerized film 9.

<Regarding Film Thickness Reduction Rate and Change Rate of Refractive Index>

Figure 5:
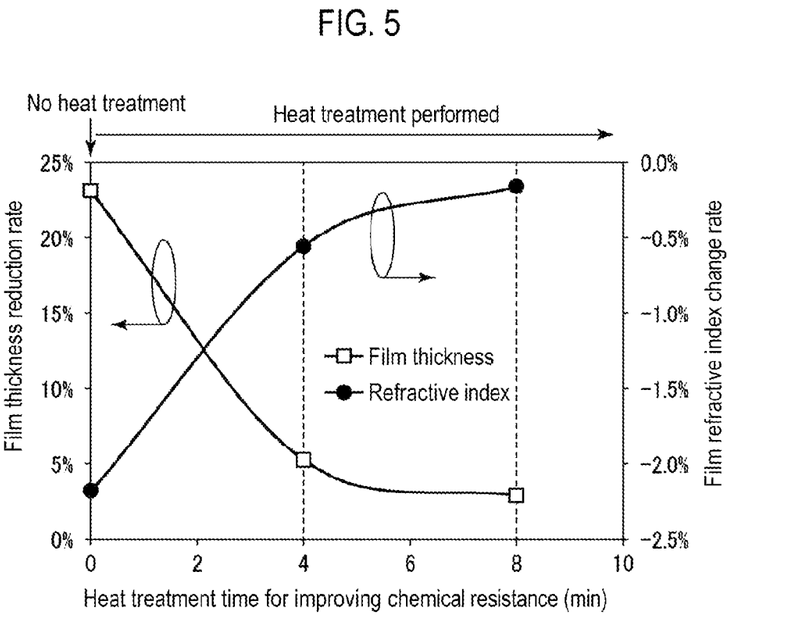
FIG. 5 is a graph showing a relationship among a time for chemical resistance improving heat treatment, a film thickness reduction rate, and a change rate of a refractive index of a film.

FIG. 5 is a graph showing a relationship among a time for the chemical resistance improving heat treatment, a film thickness reduction rate, and a change rate of a refractive index of a film. In FIG. 5, the left vertical axis and the plotting points "□" indicate how much the thickness of the polymerized film 9 at the film-forming time is reduced after the cleaning process. Furthermore, the right vertical axis and the plotting points "●" indicate how much the refractive index of the polymerized film 9 at the film-forming time is changed after the cleaning process.

<<Film Thickness Reduction Rate>>

As indicated with the left vertical axis and the plotting points "□" in FIG. 5, in a case where the chemical resistance improving heat treatment was not performed with respect to the polymerized film 9 (no heat treatment), after the polymerized film 9 is cleaned with, e.g., a cleaning agent containing an alkaline compound, the film thickness was reduced by about 23 to 24% as compared with the film thickness available before the cleaning process. One of the reasons for the film thickness reduction is presumed to be that, if the polymerized film 9 is made of polyimide, polyimide is decomposed by, e.g., a mechanism illustrated in FIGS. 6A to 6C.

Figure 6A:
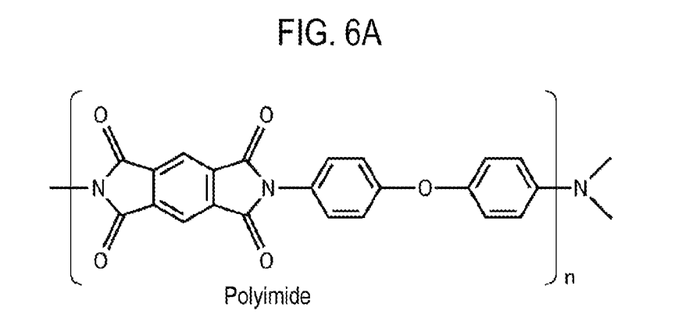
FIGS. 6A to 6C are views for explaining a polyimide decomposition mechanism.

FIG. 6A illustrates a structural formula under a state where a polyimide film is formed. The polyimide illustrated in FIG. 6A is formed by polymerizing pyromellitic acid dianhydride and oxydianiline.

Figure 6B:
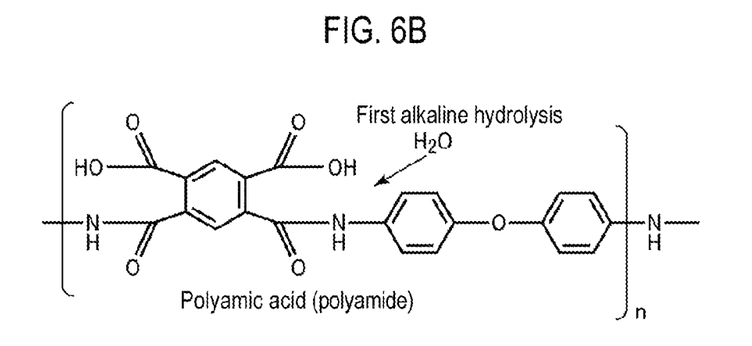

If the polyimide illustrated in FIG. 6A is brought into contact with a cleaning agent containing an alkaline compound, a first alkaline hydrolysis illustrated in FIG. 6B occurs. By virtue of the first alkaline hydrolysis, an imide ring of the polyimide is opened. As a result, the polyimide is changed to polyamic acid (polyamide).

Figure 6C:
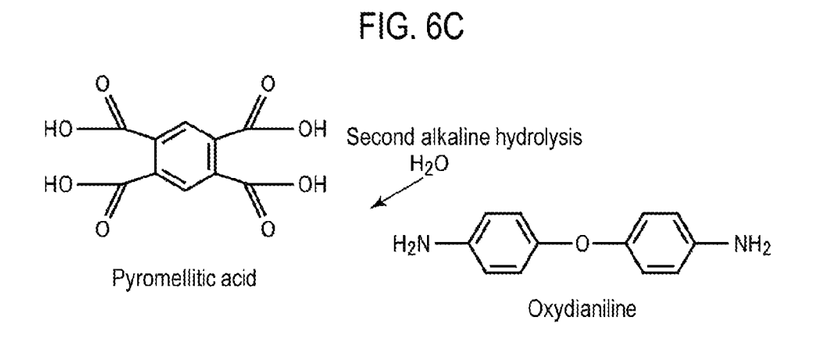

Furthermore, if the polyamic acid illustrated in FIG. 6B is brought into contact with a cleaning agent containing an alkaline compound, a second alkaline hydrolysis illustrated in FIG. 6C occurs. By virtue of the second alkaline hydrolysis, a bond of the polyamic acid is broken. As a result, the polyamic acid is decomposed into pyromellitic acid and oxydianiline.

Since the polyimide film is subjected to the decomposition illustrated in FIGS. 6A to 6C, a deterioration phenomenon, namely a film thickness reduction, is generated in the polyimide film. In the worst case, the polyimide film may be peeled off.

Referring back to FIG. 5, in a case where the polymerized film 9 has been subjected to the chemical resistance improving heat treatment (during the period from t0 to t2 in FIG. 4) for four minutes, even if a cleaning process is performed using a cleaning agent containing an alkaline compound, the film thickness reduction rate was suppressed to about 5% as compared with the film thickness available before the cleaning process. In addition, in a case where the polymerized film 9 has been subjected to chemical resistance improving heat treatment for eight minutes, the film thickness reduction rate was further suppressed to about 3 to 4% as compared with the film thickness available before the cleaning process.

As described above, in cases where the polymerized film 9 is formed by the polymerized film forming method according to one embodiment, even if chemical treatment, e.g., a cleaning process, is performed with respect to the polymerized film 9, it is possible to suppress deterioration of a film quality, namely reduction of a film thickness.

<<Change Rate of Refractive Index>>

The refractive index of the polymerized film was also examined. If the refractive index is largely changed before and after the cleaning process, it can be considered that the polymerized film is altered. Conversely, if the change in the refractive index is small, it can be considered that alteration of the polymerized film is suppressed.

As indicated with the right vertical axis and the plotting points "●" in FIG. 5, in the case where the chemical resistance improving heat treatment was not performed with respect to the polymerized film 9 (no heat treatment), a change of about −2 to 3% was observed in the refractive index before and after the cleaning process. In contrast, in the cases where the chemical resistance improving heat treatment was performed (heat treatment performed), the change in the refractive index was scarcely observed. More specifically, in the polymerized film 9 subjected to heat treatment for four minutes, the change in the refractive index before and after the cleaning process was about −0.5 to 0.6%, and in the polymerized film 9 subjected to heat treatment for eight minutes, the change in the refractive index before and after the cleaning process was about −0.1 to 0.2%.

As described above, in the polymerized film 9 formed by the polymerized film forming method according to one embodiment, even if chemical treatment, e.g., a cleaning process, is performed with respect to the polymerized film 9, it is possible to suppress alteration of the film quality.

<Heat Treatment Temperature>

In one embodiment of the present disclosure, the treatment for improving the chemical resistance of the polymerized film 9 is performed by heat treatment. A suitable temperature may exist for this heat treatment. First, a lower limit temperature in some embodiments may be set equal to or higher than a film forming temperature used when forming the polymerized film 9. This is because, it is thought that, if heat having a temperature equal to or higher than the film forming temperature is applied to the formed polymerized film 9, curing of the formed polymerized film 9 is further promoted. It may be thought that, even if the heat treatment temperature is lower than the film forming temperature, the polymerized film 9 is cured because heat is applied thereto. However, it is presumed that the curing speed is lower than that available when the heat treatment temperature is equal to or higher than the film forming temperature. Accordingly, in some embodiments, the lower limit value of the temperature of the heat treatment for improving the chemical resistance of the polymerized film 9 may be equal to or higher than the film forming temperature.

On the other hand, an upper limit temperature is set to a temperature at which the formed polymerized film 9 is not pyrolyzed. However, even if the upper limit temperature is set to a temperature at which the formed polymerized film 9 is not pyrolyzed, the upper limit temperature is required not to exceed heat resistance temperatures of semiconductor devices, internal wiring, and interlayer insulating films formed in a target object, e.g., the silicon substrate 1. Furthermore, in the provisionally-bonded silicon substrate 1 illustrated in FIGS. 3B to 3I, the upper limit temperature is required not to exceed a heat resistance temperature of a bonding agent forming the bonding layer 6. Accordingly, the upper limit value of the temperature of the heat treatment for improving the chemical resistance of the polymerized film 9 is set to be lower than the temperature at which the formed polymerized film 9 is pyrolyzed and lower than the heat resistance temperature of the target object.

The heat resistance temperature of the bonding agent forming the bonding layer 6 is very low. The heat resistance temperature of the bonding agent varies depending on the type of the bonding agent but falls within a range of about 200 to 250 degrees C. In a case where the polymerized film forming method according to one embodiment is applied to the provisionally-bonded silicon substrate 1 illustrated in FIGS. 3B to 3I, the upper limit value of the temperature of the heat treatment for improving the chemical resistance of the polymerized film 9 may be set to 250 degrees C. or less or 200 degrees C. or less.

The upper and lower limit values of the temperature of the heat treatment are upper and lower limits of the temperature of the target object accommodated in the processing chamber 103 of the film forming apparatus 100, e.g., upper and lower limits of the temperature of the provisionally-bonded silicon substrate 1 illustrated in FIGS. 3B to 3I.

According to one embodiment of the present disclosure, the heat treatment for improving the chemical resistance of the polymerized film 9 is consecutively performed subsequent to the formation of the polymerized film 9 within the processing chamber 103 where the polymerized film 9 is formed, without unloading the target object, namely the silicon substrate 1 in one embodiment, from the processing chamber 103 of the film forming apparatus 100. By consecutively performing the heat treatment within the same processing chamber 103 in this way, it is possible to obtain an advantage in that it is not necessary to prepare an additional processing apparatus in order to improve the chemical resistance of the polymerized film 9. Accordingly, it is also advantageous in that it is possible to suppress an increase in the manufacturing cost of an electronic product, e.g., a semiconductor integrated circuit device.

As described above, according to one embodiment of the present disclosure, it is possible to provide a method for improving a chemical resistance of a polymerized film, which can improve the chemical resistance of the polymerized film 9 without using an additional processing apparatus for improving the chemical resistance of the polymerized film 9. It is also possible to provide a polymerized film forming apparatus which can implement the method for improving a chemical resistance of a polymerized film and an electronic product manufacturing method using the method for improving a chemical resistance of a polymerized film.

While one embodiment of the present disclosure has been described above, the present disclosure is not limited to the aforementioned embodiment and may be differently modified without departing from the scope and spirit of the present disclosure. The embodiment described above is not a sole embodiment of the present disclosure.

For example, in the embodiment described above, there has been illustrated an example in which the heat treatment time for improving the chemical resistance of the polymerized film 9 is set to fall within a range of four to eight minutes. However, the heat treatment time is not limited to four to eight minutes. For example, in an LSI chip used in a three-dimensionally packaged LSI, four to eight minutes is one effective candidate of the heat treatment time. However, the heat treatment time may be appropriately changed depending on the size of the target object, the volume of the processing chamber 103 (which determines the ease of increase in the temperature of the target object), the type of the polymerized film and so forth.

In the embodiment described above, there has been illustrated an example in which the polymerized film 9 is used in a semiconductor integrated circuit device (an LSI chip).

However, the use of the polymerized film 9 is not limited to the semiconductor integrated circuit device. The polymerized film forming method according to one embodiment of the present disclosure may be applied to any electronic product using the polymerized film 9 without impairing the effects thereof.

In the embodiment described above, there has been illustrated an example in which the polymerized film 9 subjected to the treatment for improving the chemical resistance is the polymerized film 9 exposed to the etching process. However, the polymerized film 9 is not limited to the one exposed to the etching process. The polymerized film forming method according to one embodiment of the present disclosure may be applied to any polymerized film 9 to be subjected to chemical treatment without impairing the effects thereof.

According to the present disclosure, it is possible to provide a method for improving a chemical resistance of a polymerized film and a polymerized film forming method, which can improve the chemical resistance of the polymerized film without using an additional processing apparatus for improving the chemical resistance of the polymerized film, a polymerized film forming apparatus which can implement the polymerized film forming method, and an electronic product manufacturing method using the polymerized film forming method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a polyimide film on a surface of a target object in which a bonding layer and a through via are formed, the method comprising:
performing a treatment for increasing resistance of the polyimide film to a cleaning agent containing an alkaline compound subsequent to formation of the polyimide film within a processing chamber of a film forming apparatus where the polyimide film is formed, the treatment being performed at a temperature less than a heat resistance temperature of the bonding layer without unloading the target object from the processing chamber after the formation of the polyimide film;
anisotropically etching the polyimide film with the treatment for increasing resistance such that the polyimide film remains on a side surface of the through via; and
performing a cleaning process using the cleaning agent with respect to the polyimide film remaining on the side surface of the through via.

2. The method of claim 1, wherein the treatment for increasing the resistance to the cleaning agent is a heat treatment which is performed at a temperature higher than a formation temperature of the polyimide film.

3. The method of claim 2, wherein the heat treatment comprises:
increasing a temperature of the target object accommodated in the processing chamber to be higher than the formation temperature of the polyimide film by increasing an output of a heating device provided in the film forming apparatus to be higher than an output used during the formation of the polyimide film;
suppressing an increase in the temperature of the target object accommodated in the processing chamber by turning off the heating device and by turning on a cooling device provided in the film forming apparatus; and
returning an internal pressure of the processing chamber to an atmospheric pressure by controlling an exhaust device provided in the film forming apparatus.

4. The method of claim 3, wherein increasing a temperature of the target object and suppressing an increase in the temperature of the target object include repeating introduction of an inert gas into the processing chamber and discharge of the inert gas from the processing chamber.

5. The method of claim 2, wherein a temperature of the target object during the heat treatment is kept in a range equal to or higher than the formation temperature of the polyimide film and lower than a pyrolysis temperature of the polyimide film.

6. A method for forming a polyimide film on a surface of a target object in which a bonding layer and a through via are formed, the method comprising:
accommodating the target object in a processing chamber of a film forming apparatus;
forming the polyimide film on the surface of the target object within the processing chamber; and
performing a treatment for increasing a resistance of the polyimide film to a cleaning agent containing an alkaline compound subsequent to forming the polyimide film within the processing chamber of the film forming apparatus where the polyimide film is formed, the treatment being performed at a temperature less than a heat resistance temperature of the bonding layer without unloading the target object from the processing chamber after the formation of the polyimide film;
anisotropically etching the polyimide film with the treatment for increasing resistance such that the polyimide film remains on a side surface of the through via; and
performing a cleaning process using the cleaning agent with respect to the polyimide film remaining on the side surface of the through via.

7. The method of claim 6, wherein the treatment for increasing the resistance of the polyimide film to the cleaning agent is a heat treatment which is performed at a temperature higher than a formation temperature of the polyimide film in forming the polyimide film.

8. The method of claim 7, wherein the heat treatment comprises:
increasing a temperature of the target object accommodated in the processing chamber to be higher than the formation temperature of the polyimide film by increasing an output of a heating device provided in the film forming apparatus to be higher than an output used during forming the polyimide film;
suppressing an increase in the temperature of the target object accommodated in the processing chamber by turning off the heating device and by turning on a cooling device provided in the film forming apparatus; and
returning an internal pressure of the processing chamber to an atmospheric pressure by controlling an exhaust device provided in the film forming apparatus.

9. The method of claim 8, wherein increasing a temperature of the target object and suppressing an increase in the temperature of the target object include repeating introduction of an inert gas into the processing chamber and discharge of the inert gas from the processing chamber.

10. The method of claim 7, wherein a temperature of the target object during the heat treatment is kept in a range equal to or higher than the formation temperature of the polyimide film and lower than a pyrolysis temperature of the polyimide film.

11. An electronic product manufacturing method for manufacturing an electronic product using a target object in which a bonding layer and a through via are formed, the method comprising:
   forming a polyimide film on a surface of the target object within a processing chamber;
   performing a treatment for increasing resistance of the polyimide film to a cleaning agent containing an alkaline compound subsequent to the formation of the polyimide film within the processing chamber where the polyimide film is formed, the treatment being performed at a temperature less than a heat resistance temperature of the bonding layer without unloading the target object having the polyimide film formed thereon from the processing chamber;
   anisotropically etching the polyimide film with the treatment for increasing resistance such that the polyimide film remains on a side surface of the through via; and
   performing a cleaning process using the cleaning agent with respect to the polyimide film remaining on the side surface of the through via.

12. The method of claim 11, wherein the treatment for increasing the resistance of the polyimide film to the cleaning agent is a heat treatment which is performed at a temperature higher than a formation temperature of the polyimide film in forming the polyimide film.

13. The method of claim 12, wherein the heat treatment comprises:
   increasing a temperature of the target object accommodated in the processing chamber to be higher than the formation temperature of the polyimide film by increasing an output of a heating device provided in a film forming apparatus to be higher than an output used during forming the polyimide film;
   suppressing an increase in the temperature of the target object accommodated in the processing chamber by turning off the heating device and by turning on a cooling device provided in the film forming apparatus; and
   returning an internal pressure of the processing chamber to an atmospheric pressure by controlling an exhaust device provided in the film forming apparatus.

14. The method of claim 13, wherein increasing a temperature of the target object and suppressing an increase in the temperature of the target object include repeating introduction of an inert gas into the processing chamber and discharge of the inert gas from the processing chamber.

15. The method of claim 12, wherein a temperature of the target object during the heat treatment is kept in a range equal to or higher than the formation temperature of the polyimide film and lower than a pyrolysis temperature of the polyimide film.

* * * * *